(12) United States Patent
Batra et al.

(10) Patent No.: US 9,939,487 B2
(45) Date of Patent: Apr. 10, 2018

(54) CIRCUIT DESIGN VERIFICATION IN A HARDWARE ACCELERATED SIMULATION ENVIRONMENT USING BREAKPOINTS

(71) Applicant: International Business Machines Corporation, Armonk, NY (US)

(72) Inventors: Rahul Batra, Austin, TX (US); Debapriya Chatterjee, Austin, TX (US); John C. Goss, Wendell, NC (US); Christopher R. Jones, Round Rock, TX (US); Christopher M. Riedl, Leander, TX (US); John A. Schumann, Austin, TX (US); Karen E. Yokum, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/975,013

(22) Filed: Dec. 18, 2015

(65) Prior Publication Data

US 2017/0176529 A1 Jun. 22, 2017

(51) Int. Cl.
 *G06F 17/50* (2006.01)
 *G01R 31/317* (2006.01)
 *G01R 31/3177* (2006.01)

(52) U.S. Cl.
 CPC ... *G01R 31/31704* (2013.01); *G01R 31/3177* (2013.01); *G01R 31/31723* (2013.01)

(58) Field of Classification Search
 CPC ........... G06F 147/5022; G06F 17/5027; G06F 17/5009
 USPC ......................................................... 716/136
 See application file for complete search history.

(56) References Cited

U.S. PATENT DOCUMENTS

| | | | |
|---|---|---|---|
| 8,352,231 | B2 | 1/2013 | Babinsky et al. |
| 8,495,535 | B2 | 7/2013 | Hidvegi et al. |
| 9,317,636 | B1 | 4/2016 | Petras et al. |
| 2006/0143522 | A1 | 6/2006 | Multhaup et al. |
| 2011/0040920 | A1* | 2/2011 | Chou et al. ................... 710/316 |
| 2011/0041105 | A1* | 2/2011 | Chou et al. ................... 716/106 |
| 2012/0317533 | A1 | 12/2012 | Zawalski et al. |

(Continued)

OTHER PUBLICATIONS

Zhang, Justin, "UVM Acceleration The Most Effective Way to Shorten Your Verification Cycle", Mentor Graphics. Dec. 2014, <http://testandverification.com/DVClub/china/DVClub_05_Dec_2014/Justin_Zhang.pdf, (39 pgs.).

(Continued)

*Primary Examiner* — Suchin Parihar
(74) *Attorney, Agent, or Firm* — Patterson + Sheridan, LLP

(57) ABSTRACT

Embodiments of the present disclosure provide a method, a system, and a computer readable storage medium for circuit design verification. The user generates a breakpoint by execution of test bench code. A callback function is registered at an application level associated with the breakpoint. The callback function is configured to execute in response to an occurrence of the associated breakpoint at the system level. A hardware-accelerated simulator simulates an execution of a circuit design using the test bench code. In response to triggering the breakpoint at the system level, the execution of the circuit design at the system level is paused and the callback function associated with the breakpoint at the application level is executed.

20 Claims, 5 Drawing Sheets

(56) References Cited

U.S. PATENT DOCUMENTS

| | | | |
|---|---|---|---|
| 2013/0179142 A1 | 7/2013 | Kim et al. | |
| 2014/0019929 A1 | 1/2014 | Raviv et al. | |
| 2015/0301108 A1* | 10/2015 | Hamid | G01R 31/3177 |
| | | | 714/724 |

OTHER PUBLICATIONS

"Comprehensive UVM/OVM Acceleration", Cadence, 2011. http://www.cadence.com/rI/Resources/white_papers/UVM_OVM_Accell_WP.pdf, (10 pgs).

* cited by examiner

| cycle | UserObj::callback() | |
|---|---|---|
| 1,00,000 | A::check_val() | 402 |
| 2,00,000 | B::do_flush() | 406 |
| 3,00,000 | C::is_empty() | 408 |

Timed Breakpoint Module 400

FIG. 4

CIRCUIT DESIGN VERIFICATION IN A HARDWARE ACCELERATED SIMULATION ENVIRONMENT USING BREAKPOINTS

BACKGROUND

1. Field of the Invention

The present disclosure relates to processing systems and processors, and more specifically to techniques for circuit design verification.

2. Description of Related Art

Computerized devices control many aspects of life—from writing documents to controlling traffic lights. However, computerized devices are bug-prone, and thus require a testing phase in which the bugs should be discovered. The testing phase is considered one of the most difficult tasks in designing a computerized device. The cost of not discovering a bug may be enormous, as the consequences of the bug may be disastrous. Additionally, a bug in hardware or firmware may be expensive to fix, as patching it requires call-back of the computerized device. Hence, many developers of computerized devices invest a substantial portion of the development cycle to discover erroneous behaviors of the computerized device.

During the development cycle of a circuit, the functionality of the circuit may be analyzed using functional verification. Functional verification may be performed using a simulator, such as Hardware Descriptive Language (HDL) simulator, which provides a software simulation of the behavior of the circuit. Additionally or alternatively, an acceleration platform, also referred to as an "accelerator" or a "hardware accelerator", may be utilized to perform functional verification. As the accelerator is implemented in hardware it is much faster than a simulator. On the downside, there is a reduced visibility to the value of each signal in the circuit design during the simulated execution by the accelerator with respect to a simulator.

SUMMARY

Embodiments of the present disclosure provide a method, a system, and a computer readable storage medium for circuit design verification. The user generates a breakpoint by execution of test bench code. A callback function is registered at an application level associated with the breakpoint. The callback function is configured to execute in response to an occurrence of the associated breakpoint at the system level. A hardware-accelerated simulator simulates an execution of a circuit design using the test bench code. In response to triggering the breakpoint at the system level, the execution of the circuit design at the system level is paused and the callback function associated with the breakpoint at the application level is executed.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 illustrates one example of a breakpoint that might occur, according to one embodiment.

For clarity, identical reference numerals have been used, where applicable, to designate identical elements that are common between figures. Additionally, elements of one embodiment may be adapted for use with other embodiments.

DETAILED DESCRIPTION

Figure 1:
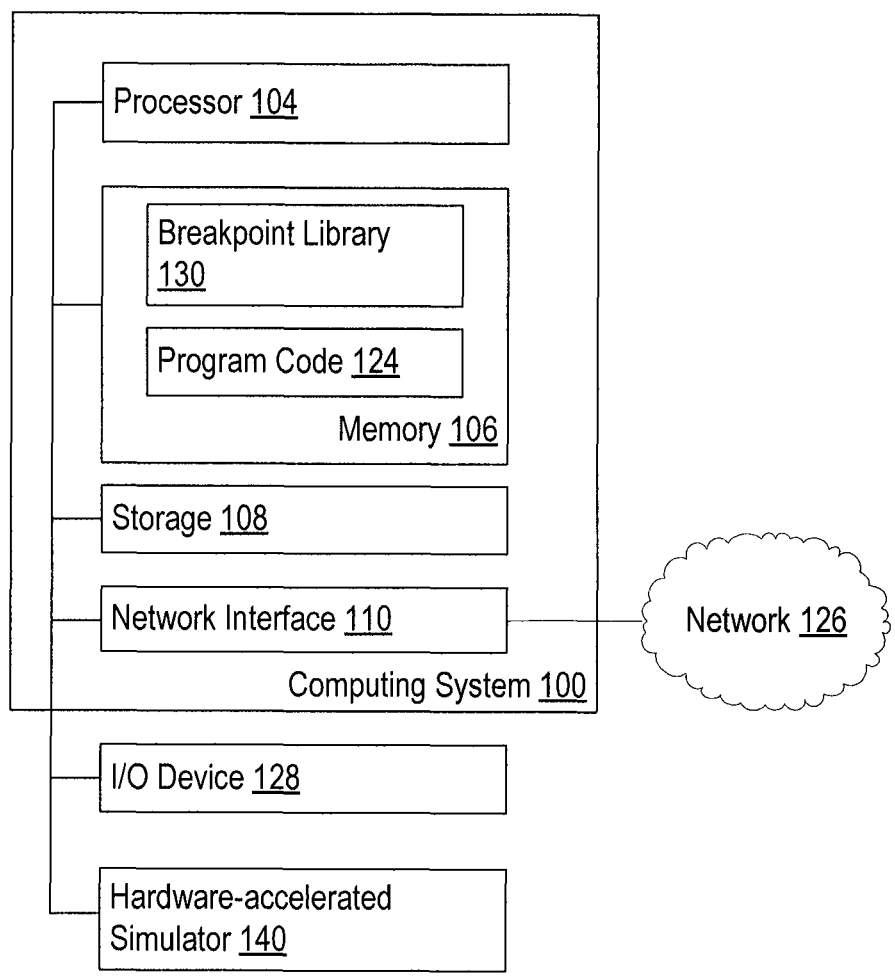
FIG. 1 is a block diagram illustrating a computing system, according to one embodiment disclosed herein.

FIG. 1 is a block diagram illustrating a computing system 100, according to one embodiment disclosed herein. The computing system 100 includes a processor 104, memory 106, storage 108, and a network interface 110. The processor 104 retrieves and executes programming instructions stored in memory 106 as well as stores and retrieves application data residing in the cache 112. The processor 104 is included to be representative of a single processor, multiple processors, a single processor having multiple processing cores, and the like. The storage 108 may be a disk drive storage device. Although shown as a single unit, the storage 108 may be a combination of fixed and/or removable storage devices, such as fixed disk drives, removable memory cards, optical storage, network attached storage (NAS), or storage-area-network (SAN). The network interface 110 may be any type of network communications allowing the computing system 100 to communicate with other computers via a network 126. The computing system 100 also includes an I/O device 128 (e.g. keyboard and mouse devices) connected to the computing system 100.

The computing system 100 further includes a hardware-accelerated simulator 140 connected to computing system 100. The hardware-accelerated simulator 140 is configured to simulate an execution of a circuit design using test bench code. The hardware-accelerated simulator 140 is a special-purpose machine that can be programmed by loading its memory with an instruction stream produced prior to simulation by a compiler that schedules each logical primitive at a specific time on a specific processor. In some embodiments, the hardware-accelerated simulator may be comprised of one or more Application-Specific Integrated Circuit (ASIC), Field Programmable Gate Array (FPGA), or the like. Compared to software-only-based simulators, hardware-accelerated simulator 140 provides a level of simulation performance necessary to perform end-to-end system level checking for modern system-on-chip designs with a reasonable turnaround period for a simulate-debug-fix-rebuild-rerun cycle.

The memory 106 includes program code 124 instructions for application(s) and a breakpoint controller 130. The breakpoint controller 130 is configured to store breakpoints for pausing the hardware-accelerated simulator 140 during simulation. The breakpoint controller 130 bridges the gap between the system level (or lower level) of the hardware-accelerated simulator 140 and the application level (or higher level) test bench code. This allows the hardware-accelerated simulator 140 to achieve close to maximum performance because, unlike software simulators where test bench code is evaluated after each simulation cycle, this solution can executes test bench code at sparse intervals (triggered by the breakpoints) of system level checks or monitors. In one embodiment, the breakpoint controller 130 can be implemented by a library layer used by the test bench code.

Figure 2:
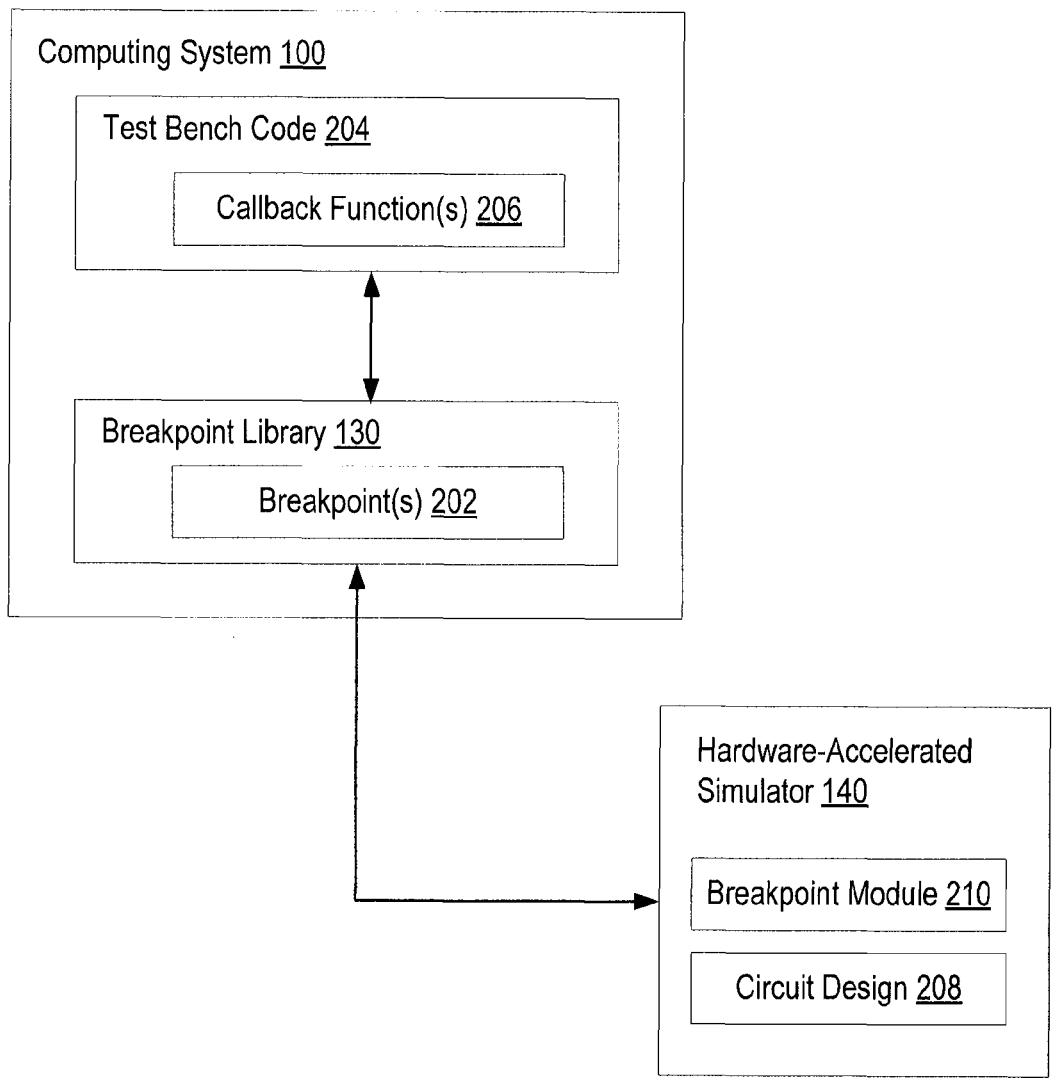
FIG. 2 illustrates a block diagram of the computing system in FIG. 1 interacting with the hardware-accelerated simulator, according to one embodiment

FIG. 2 illustrates a block diagram of the computing system 100 interacting with the hardware-accelerated simulator 140, according to one embodiment. Although hardware-accelerated simulators provide an increase level of simulation performance, executing typical unit-level software test bench code on a hardware-accelerated environment leads to inefficiencies in utilizing the full extent of the simulation performance offered by the hardware-accelerated simulator 140. Using the breakpoint controller 130 in the computing system 100 bridges the gap between the lower-level hardware-accelerated simulator 140 and the higher-level test bench code.

The computing system 100 includes the breakpoint controller 130 and software test bench code 204. The breakpoint controller layer 130 maintains one or more breakpoints 202 associated with simulation of the circuit design 208. The breakpoints 202 may be set by the user, for example, by execution of the test bench code 204 invoking an application programming interface (API) exposed by the breakpoint controller 130. In one embodiment, breakpoints 202 may include timed breakpoints (see FIG. 4), facility breakpoints (see FIG. 5), event listeners, and the like.

The software test bench code 204 includes checking and monitoring code written by a user (e.g., verification engineer) and when executed by the computing system 100 are configured to test the circuit design 208, e.g., verify that the circuit design 208 adheres to a particular specification. In one or more embodiments, the software test bench code 204 includes a plurality of callback functions 206 associated with the breakpoints 202 in the breakpoint controller 130. User code functions are registered via the library 130 to be called when a certain event has become active. These functions can contain the checking and monitoring code that the verification engineer intended to execute. The user may associate a specific callback function 206 with a specific breakpoint that executes when the breakpoint occurs.

The hardware-accelerated simulator 140 includes a breakpoint module 210 and a circuit design 208. A circuit design 208 is a functional definition of an electronic circuit, e.g., a target processor, chip, integrated circuit (IC) or other hardware product. The circuit design 208 may be provided in a computer-readable form using any hardware description language (HDL) including but not limited to VHDL, Verilog, SystemC, EDL, RTL, PSL or the like. The circuit design 208 can be loaded into the hardware-accelerated simulator 140 to simulate operation of the circuit design 208.

The breakpoint module 210 is configured to provide simulator-level breakpoint functionality, which is triggered by a value change in an observed design signal. In one or more embodiments, the breakpoint module 210 is configured to communicate with the breakpoint controller 130 when a breakpoint within the hardware-accelerated simulator occurs. When a breakpoint occurs, the breakpoint module 210 pauses the hardware-accelerated simulator 140 so that control can be transferred from the system-level hardware-accelerated simulator 140 to the application-level execution of test bench code 204 for handling. As described in detail below, one type of simulator breakpoints are timed breakpoints, which occur in the hardware-accelerated simulator 140 when a preset number of simulation cycles has elapsed. Facility breakpoints occur when a design signal changes value. In some embodiments, access to the breakpoint module 210 may be provided by a lower level breakpoint application program interface (API). Whenever a simulator breakpoint or a breakpoint from a lower level breakpoint API occurs, the hardware-accelerated simulator 140 will pause and return control to the software test bench code being executed on the host platform (computing system 100) attached to the hardware-accelerated simulator 140.

Figure 3:
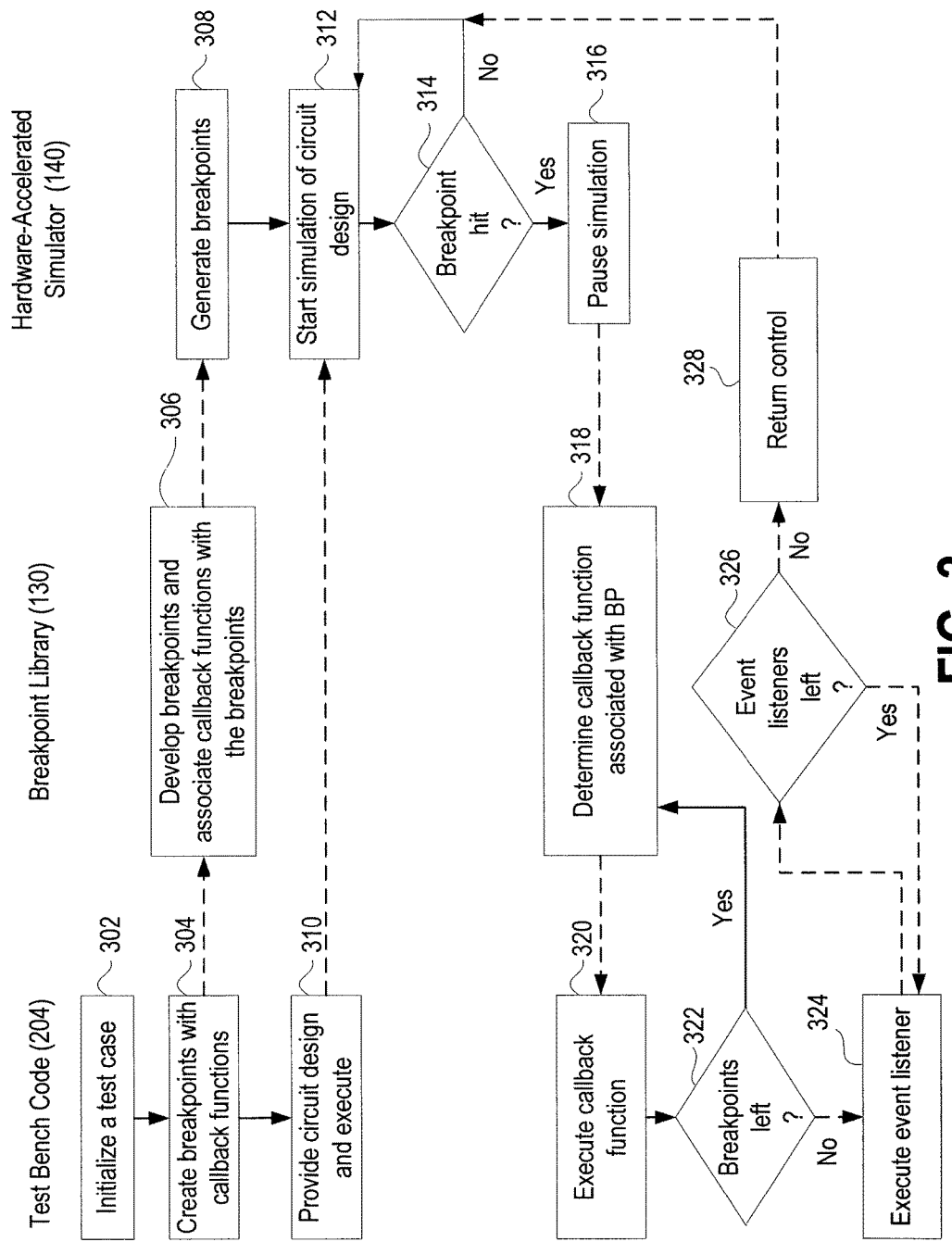
FIG. 3 is a flow diagram illustrating a method for circuit design verification, according to one embodiment.

FIG. 3 is a flow diagram illustrating a method 300 for circuit design verification, according to one embodiment. FIG. 3 illustrates the method 300 from the viewpoints of the application level, the library layer level, and the simulator level.

The method 300 begins at step 302 in the application layer. At step 302, the processor initializes a test case. The test case includes test bench code developed for a particular test scenario to determine whether an application, software system, or one of its features is working as it was originally established to do.

At step 304, the test bench code creates breakpoints with callback functions. The callback functions will be associated with the breakpoints to allow for execution of the callback function when the breakpoint occurs. An example in pseudo-code of test bench code configured to create breakpoint is provided in Table 1 below.

TABLE 1

```
#include "BreakPointController.h"
class myMonitor : public BpcObject
{
  public:
    myMonitor(params) : BpcObject(params)
    {
      // Setup callback pointer
        myCallback = new BpcCallback<myMonitor>(this,
          &myMonitor::callback);
      BpcManager::TimedBreakpointInstance tbi, tbi2;
      tbi = BpcManager->addTimedBp(300, myCallback);
      tbi2 = BpcManager->addTimedBp(1000, BACKGROUND_
      PERSISTENT,
        myCallback);
    }
    void callback( );
  private:
    BpcObject::BpcCallback<myMonitor> * myCallback;
};
```

In the example in Table 1, the breakpoint controller is provided as a library (i.e., BreakPointController.h") having one or more class and function definitions (e.g., "BpcObject", "BpcCallback", "BpcManager") that may be utilized by the test bench code. The test bench code specifies a callback function "myCallback( )" that is to be executed on a given breakpoint. In this example, the test bench code invokes the addTimedBp( ) function provided by the breakpoint controller library to create timed breakpoints: tbi and tbi2.

In some embodiments, in creating a timed breakpoint, the test bench code may specify parameters, such as an offset parameter, a simulation action event parameter, and a reference to the callback to be taken. The offset parameter indicates a number of cycles from the present time in which to invoke the callback. For example, the first timed breakpoint instance tbi (i.e., "addTimedBp(300, myCallback")) is specified to be triggered when the simulation reaches 300 cycles. The simulation action event parameter can be used to indicate whether a breakpoint is to be handled in the background and to re-arm the breakpoint after the callback is taken (e.g., "BACKGROUND_PERSISTENT"), or in other cases, to not re-arm after the callback is taken (e.g., "BACKGROUND_ONESHOT"). For example, the timed breakpoint instance tbi2 (i.e., "addTimedBp(1000, BACKGROUND_PERSISTENT, myCallback)") is specified to be triggered when the simulation reaches 1000 cycles and is to be re-armed.

Another example in pseudocode of test bench code configured to create facility breakpoint is provided in Table 2 below.

TABLE 2

BpcObject::BpcCallback<myMonitor> * myCallback, myCallback2;
myMonitor(parent, objectName, replicaID) : BpcObject(params),
myFac(this, "my_fac", "")
{
    REGISTER_RESET(myMonitor, reset);
    REGISTER_POST_INIT_HARDWARE(myMonitor, postHW);
}
MyMonitor::reset( )
{
    // Register with Breakpoint Controller library
    REGISTER_SIMBPFAC(myFac);
}
MyMonitor::postHw( ) {
    BreakpointFac::BreakpointInstance* myBpInstance1, myBpInsance2;
    if(myFac.get64( )!=0x1) {
        myCallback = new BpcObject::BpcCallback<myMonitor>(this,
            &myMonitor::callback);
        //Call myCallback whenever ADDR.A changes to 0x1
        myBpInstance1 = myFac.addBreakpoint(CHANGETO,
            BACKGROUND_PERSISTENT, 1,
            myCallback);
    } else {
        myCallback2 = new BpcObject::BpcCallback<myMonitor>(this,
            &myMonitor::callback2);
        //Call myCallback2 whenever ADDR.A changes
        myBpInstance2 = myFac.addBreakpoint(ANYCHANGE,
            BACKGROUND_PERSISTENT,
            myCallback2);
    }
}
MyMonitor::callback( ) { }
MyMonitor::callback2( ) { }

Similar to the example in Table 1, the test bench code in Table 2 uses one or more class and function definitions (e.g., "BpcObject", "BpcCallback", "BpcManager") to create one or more facility breakpoints. In this example, the test bench code invokes the addBreakpoint( ) function provided by the breakpoint controller library to create facility breakpoints: myBpInstance1 and myBpInstance2.

In some embodiments, the test bench code first registers facilities with a breakpoint facility manager (i.e., "REGISTER_SIMBPFAC(myFac);"). In some embodiments, in creating a facility breakpoint, the test bench code may specify parameters, such as a sub command event parameter, a simulation action event parameter, and a reference to the callback to be taken. The sub command event parameter indicates the type of change to a facility that will cause the breakpoint. For example, the first facility breakpoint instance myBpInstance1 is specified, by the parameter value CHANGETO, to be triggered when the facility ADDR.A changes to a particular target value (i.e., "0x1"). In another example, the second facility breakpoint instance myBpInstance2 is specified, by the parameter value ANYCHANGE, to be triggered when any change to the facility ADDR.A happens. The simulation action event parameter can be used to indicate whether a breakpoint is to be handled in the background and to re-arm the breakpoint after the callback is taken (e.g., "BACKGROUND_PERSISTENT"), or in other cases, to not re-arm after the callback is taken (e.g., "BACKGROUND_ONESHOT").

At step 306, the breakpoint controller generates the breakpoints and records the callback functions with the associated breakpoint. The breakpoint controller acts a bridge between the lower-level breakpoint API of a hardware-accelerated simulator and the system level checker and monitor code used for validation of a digital design that is being simulated on the hardware-accelerated simulator. The breakpoint controller assists verification engineers by allowing rapid creation of system-level checkers and monitors that will make efficient use of the performance of hardware-accelerated simulation.

At step 308, the hardware-accelerated simulator 140 generates simulation-layer breakpoints associated with the breakpoints in the breakpoint controller. For example, the hardware-accelerated simulator may generate a timed breakpoint (discussed in FIG. 4) or a facility breakpoint (discussed in FIG. 5).

At step 310, the user provides the circuit design to the application level, and executes the circuit design. The circuit design 208 may be provided in a computer-readable form using any hardware description language (HDL) including but not limited to VHDL, Verilog, SystemC, EDL, RTL, PSL or the like. The circuit design can be loaded into the hardware-accelerated simulator 140 to simulate operation of the circuit design.

At step 312, the hardware-accelerated simulator begins simulation of the circuit design. Simulating the circuit design allows for the functionality of the circuit design to be analyzed using functional verification. During simulation, the hardware-accelerated simulator will check if breakpoints are triggered, which will pause simulation.

At step 314 the hardware-accelerated simulator determines whether a breakpoint occurs. A breakpoint occurs at the hardware-accelerated simulator level if a breakpoint at the breakpoint controller layer that is associated with a breakpoint at the hardware accelerated simulator is triggered. If a breakpoint has not occurred, the hardware-accelerated simulator continues to execute the circuit design.

If a breakpoint has occurred, then at step 316 the hardware-accelerated simulator pauses simulation and transfers control to the breakpoint controller. When the hardware-accelerated simulator transfers control to the breakpoint controller, this allows the breakpoint controller to execute a callback function associated with the breakpoint that caused the pause in simulation.

At the breakpoint controller layer, at step 318, the breakpoint controller determines the callback function associated with the breakpoint that triggered the hardware-accelerated simulator to pause. The callback function associated with the breakpoint that triggered the hardware-accelerated simulator to pause will have a callback function associated with it for execution.

At the application level, at step 320, the processor executes the callback function associated with the breakpoint. The callback functions may include checking and monitoring code that the verification engineer intended to execute. The callback functions themselves may create and register further callbacks.

At step 322, the processor determines whether there are any timed breakpoints or facility breakpoints left. If there are timed breakpoints or facility breakpoints left, then the method reverts to step 318. If there are not any timed breakpoints left, at step 324 the library layer may use an event listener to execute the test bench code in a cascaded fashion. Similar to the breakpoints, event listeners can also have callback functions associated with them. After executing all the breakpoints, the breakpoint controller will scan the event-listeners and execute the associated callback functions. The breakpoint controller will do this until there are not any event listeners remaining.

At step 326, the processor determines whether there are any event listeners left. If there are event listeners left, the method 300 reverts to step 324. If there are not any event listeners left, at step 328 the processor returns control from the higher, application level back to the lower, system level, and reverts to step 312.

The breakpoints and the event listeners can create complex checkers and monitors when used in conjunction with each other. As used herein, a checker refers to program code configured to verify the outputs of a device-under-test, and a monitor refers to program code configured to watch interfaces and internal signals to assist the operations of the checker. Some of the commonly used complex constructs can be created out of the breakpoints and the event listeners as a generic template. The generic template can be inherited by users to allow rapid development of certain monitors and checkers.

For example, in one embodiment, a cascade checker construction may be used. Certain system level checks can only be performed when any or all of the preconditions of that check have been met. These preconditions can be detected via events themselves. A breakpoint can indicate one of these preconditions. The detection of the precondition can be conveyed via an event-listener to the cascade checker. The cascade check can itself activate another event listener when any of the precondition events or all of the precondition events has occurred.

In another embodiment, a state machine construction may be used. The state machine construction is used to track the evolution of an ongoing process in the circuit design. Different breakpoints may transition between states that are stored as part of a status of the state machine construct. If any of the events that are marked as a transition edge in the state machine take place, the callback function calls the state machine to update the state function. Based on the current state and the type of callback, the next state is chosen. The construct is effective for following the evolution of a recovery state machine or a power management state transition sequence in the micro-architecture of a design circuit.

FIG. 4 illustrates one example of a breakpoint that might occur at step 314, according to one embodiment. A timed breakpoint occurs when a preset number of simulation cycles has elapsed. The breakpoint controller maintains a sorted queue of all timed breakpoints and the user callbacks functions associated with the timed breakpoints in ascending order. FIG. 4 illustrate a timed breakpoint module 400 in the breakpoint controller. The breakpoint module 400 includes a plurality of timed breakpoints 402, 404, 406. Timed breakpoint 402 is set to occur at the 1,000,000th cycle. The callback function associated with timed breakpoint 402 is A::check_val( ). Timed breakpoint 404 is set to occur at the 2,000,000th cycle. The callback function associated with timed breakpoint 404 is B::do_flush( ). Timed breakpoint 406 is set to occur at the 3,000,000th cycle. The callback function associated with timed breakpoint 406 is C::is_empty. When the simulation cycle matches one of the timed breakpoints 402-406, control will be transferred from the hardware-accelerated simulator to the breakpoint controller to determine the breakpoint triggered and the associated callback function. For example, at the 1,000,000th cycle, the breakpoint controller determines that timed breakpoint 402 was triggered, and its associated callback function is A::check_val. At the application level, the processor then executes the callback function A::check_val, and returns control to the hardware-accelerated simulator when execution is complete.

Figure 5:
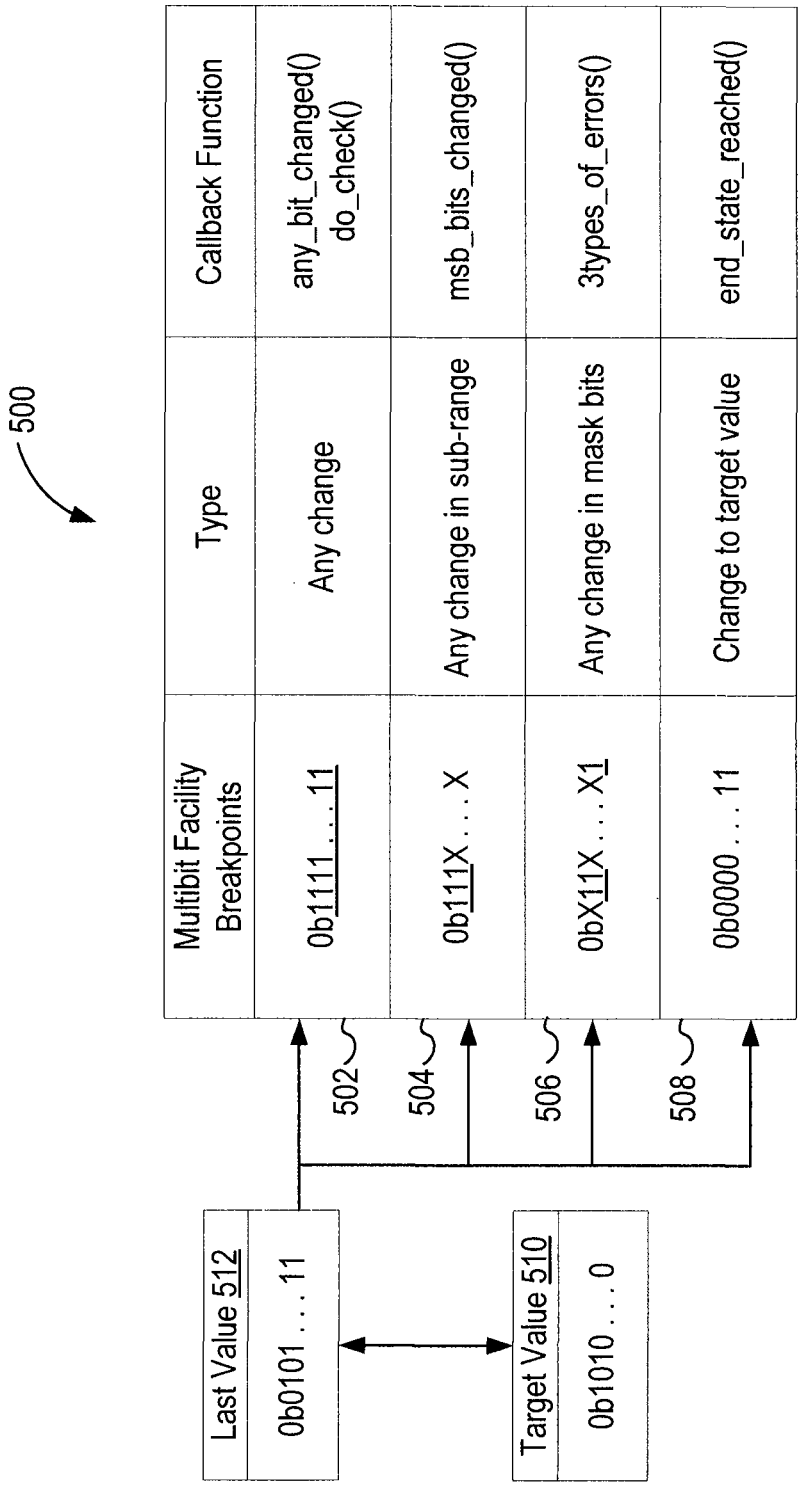
FIG. 5 illustrates one example of a breakpoint that might occur, according to one embodiment.

FIG. 5 illustrates one example of a breakpoint that might occur at step 314, according to one embodiment. The breakpoint controller may include a facility breakpoint manager 500, which provides a plurality of facility breakpoints 502, 504, 506, 508. A facility breakpoint occurs when a designated design signal changes value. Rather than simply using the single bit facility breakpoints provided by the simulator 140, the breakpoint controller layer provides facility breakpoints 502-508 which are multi-bit facility breakpoints that correspond to underlying simulator breakpoints that may be single bit signals.

In operation, test bench code registers a multi-bit design signal (e.g., target value 510) with the breakpoint controller layer to be able to be breakpointed on. On such a registration, the breakpoint controller layer internally creates a list of single bit breakpoints that are associated with the multibit facility. Multiple multibit facilities (e.g., breakpoints 502-508) can share the same bits of a design signal. Hence, such aliasing is identified and a unique set of single bit breakpoints are maintained by the breakpoint layer. Test bench code can register a number of callback functions with the facility alongside ignore value masks or target values of the facility value as the activation condition of the breakpoint.

The breakpoint controller layer compares a last value data signal 512 with the current data signal. For example, in the facility breakpoint manager 500, there are four multibit facility breakpoints 502-508. Facility break point 502 is activated when there is any change in the bits of from the last value 512. Facility breakpoint 504 is triggered when there is a change in a sub-range of bits from the last value 512. Facility breakpoint 506 is triggered when there is any change in a specific number of bits. Facility breakpoint 508 is triggered when the last value is equal to a target value 510. The facility breakpoint manager maintains a list of all multibit facilities 502-508 alongside their associated callbacks. When the monitoring function is activated due to a single breakpoint triggering in the simulator, the monitoring function calls the facility breakpoint manger 500 which ascertains which of the multibit facilities 502-508 are activated given the single bit facility. The facility breakpoint manager 500 will then go through the list of all associated callbacks, and if the current value of the multibit facility is not marked off or matches the target value, the facility breakpoint manager 500 will call the corresponding call back.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method, comprising:
   initializing, by a computer processor in a computing system, a test case for a circuit design;
   generating a breakpoint within a hardware-accelerated simulator, wherein the hardware accelerated simulator is configured to simulate execution of the circuit design as part of the test case;
   registering a callback function at an application level of a test bench, the callback function associated with the breakpoint and configured to execute in response to an occurrence of the associated breakpoint at the hardware-accelerated simulator;
   simulating, by the hardware-accelerated simulator, execution of the circuit design; and
   responsive to triggering the breakpoint at the hardware-accelerated simulator: (i) pausing the execution of the circuit design simulation at the hardware-accelerated simulator and (ii) executing the callback function associated with the breakpoint at the application level of the test bench.

2. The method of claim 1, wherein the breakpoint is a timed breakpoint configured to be triggered at an occurrence of a number of simulation cycles.

3. The method of claim 1, wherein the breakpoint is a facility breakpoint configured to be triggered when bits in the facility breakpoint correspond to bit changes from a last value during simulation.

4. The method of claim 1, wherein the breakpoint is an event listener.

5. The method of claim 1, wherein responsive to executing the callback function associated with the breakpoint, unpausing the execution of the circuit design at the hardware-accelerated simulator.

6. The method of claim 1, wherein generating a breakpoint comprises:
   generating a breakpoint at the hardware accelerated simulator via an advanced program interface of the hardware-accelerated simulator.

7. The method of claim 1, wherein a complex checker is used to monitor the execution of the circuit design simulation.

8. A system, comprising:
   a hardware-accelerated simulator;
   a computer processor in communication with the hardware-accelerated simulator; and
   a memory, storing program code, which when executed on the processor, performs an operation of circuit design verification, the operation comprising:
      initializing a test case for a circuit design;
      generating a breakpoint within a hardware-accelerated simulator, wherein the hardware accelerated simulator is configured to simulate execution of the circuit design as part of the test case;
      registering a callback function at an application level of a test bench, the callback function associated with the breakpoint and configured to execute in response to an occurrence of the associated breakpoint at the hardware-accelerated simulator;
      simulating by the hardware-accelerated simulator, execution of the circuit design; and
      responsive to triggering the breakpoint at the hardware-accelerated simulator: (i) pausing the execution of the circuit design simulation at the hardware-accelerated simulator and (ii) executing the callback function associated with the breakpoint at the application level of the test bench.

9. The system of claim 8, wherein the breakpoint is a timed breakpoint configured to be triggered at an occurrence of a number of simulation cycles.

10. The system of claim 8, wherein the breakpoint is a facility breakpoint configured to be triggered when bits in the facility breakpoint correspond to bit changes from a last value during simulation.

11. The system of claim 8, wherein the breakpoint is an event listener.

12. The system of claim 8, wherein responsive to executing the callback function associated with the breakpoint, unpausing the execution of the circuit design at the hardware-accelerated simulator.

13. The system of claim 8, wherein generating a breakpoint comprises:
   generating a breakpoint at the hardware accelerated simulator via an advanced program interface of the hardware-accelerated simulator.

14. The system of claim 8, wherein a complex checker is used to monitor the execution of the circuit design simulation.

15. A computer readable storage medium having stored thereon instructions that when executed by a processor causes a processor to perform an operation for circuit design verification, comprising:
   initializing, by the processor, a test case for a circuit design;
   generating a breakpoint within a hardware-accelerated simulator, wherein the hardware accelerated simulator is configured to simulate execution of the circuit design as part of the test case by execution of test bench code;
   registering a callback function at an application level of a test bench, the callback function associated with the breakpoint and configured to execute in response to an occurrence of the associated breakpoint at the system level hardware-accelerated simulator;
   simulating, by the hardware-accelerated simulator, execution of the circuit design using the test bench code; and
   responsive to triggering the breakpoint at the system level hardware-accelerated simulator: (i) pausing the execution of the circuit design simulation at the system level hardware-accelerated simulator and (ii) executing the callback function associated with the breakpoint at the application level of the test bench.

16. The computer readable storage medium of claim 15, wherein the breakpoint is a timed breakpoint configured to be triggered at an occurrence of a number of simulation cycles.

17. The computer readable storage medium of claim 15, wherein the breakpoint is a facility breakpoint configured to be triggered when bits in the facility breakpoint correspond to bit changes from a last value during simulation.

18. The computer readable storage medium of claim 15, wherein the breakpoint is an event listener.

19. The computer readable storage medium of claim 15, wherein responsive to executing the callback function associated with the breakpoint, unpausing the execution of the circuit design at the hardware-accelerated simulator.

20. The computer readable storage medium of claim 15, wherein generating a breakpoint comprises:

generating a breakpoint at the hardware-accelerated simulator via an advanced program interface of the hardware-accelerated simulator.

\* \* \* \* \*